United States Patent
Chang et al.

(10) Patent No.: US 7,259,965 B2
(45) Date of Patent: Aug. 21, 2007

(54) INTEGRATED CIRCUIT COOLANT MICROCHANNEL ASSEMBLY WITH TARGETED CHANNEL CONFIGURATION

(75) Inventors: Je-Young Chang, Phoenix, AZ (US); Ioan Sauciuc, Phoenix, AZ (US); Chuan Hu, Chandler, AZ (US); Chia-Pin Chiu, Tempe, AZ (US); Gregory M. Chrysler, Chandler, AZ (US); Ravi S. Prasher, Phoenix, AZ (US); Rajiv K. Mongia, Fremont, CA (US); Himanshu Pokharna, San Jose, CA (US); Eric DiStefano, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 11/101,061

(22) Filed: Apr. 7, 2005

(65) Prior Publication Data
US 2006/0226539 A1    Oct. 12, 2006

(51) Int. Cl.
*H05K 7/20* (2006.01)

(52) U.S. Cl. .................. 361/699; 361/700; 361/702; 257/714; 165/80.4

(58) Field of Classification Search ........ 361/685–688, 361/697–702, 704–714, 720–727, 735, 782; 165/104.33, 80.3, 80.4; 257/713–715; 174/15.1, 174/16.3; 62/233, 259.2, 238.6, 113, 419, 62/225
See application file for complete search history.

(56) References Cited

U.S. PATENT DOCUMENTS

| | | | |
|---|---|---|---|
| 5,835,345 A * | 11/1998 | Staskus et al. | 361/699 |
| 6,337,794 B1 * | 1/2002 | Agonafer et al. | 361/690 |
| 6,517,234 B1 * | 2/2003 | Kopf-Sill et al. | 366/340 |
| 6,951,243 B2 * | 10/2005 | Nilson et al. | 165/104.21 |
| 6,988,534 B2 * | 1/2006 | Kenny et al. | 165/80.4 |
| 7,134,486 B2 * | 11/2006 | Santiago et al. | 165/104.28 |

* cited by examiner

*Primary Examiner*—Michael Datskovskiy
(74) *Attorney, Agent, or Firm*—Buckley, Maschoff & Talwalkar LLC

(57) ABSTRACT

A microchannel structure has microchannels formed therein. The microchannels are to transport a coolant and to be proximate to an integrated circuit to transfer heat from the integrated circuit to the coolant. At least one of the microchannels has a length extent and has a first section at a first location along the length extent and a second section at a second location along the length extent. The first section of the microchannel has a first aspect ratio and the second section is divided into at least two sub-channels. Each sub-channel has a respective second aspect ratio that is greater than the first aspect ratio.

14 Claims, 17 Drawing Sheets

INTEGRATED CIRCUIT COOLANT MICROCHANNEL ASSEMBLY WITH TARGETED CHANNEL CONFIGURATION

BACKGROUND

As microprocessors advance in complexity and operating rate, the heat generated in microprocessors during operation increases and the demands on cooling systems for microprocessors also escalate. A particular problem is presented by so-called "hotspots" at which circuit elements at a localized zone on the microprocessor die raise the temperature in the zone above the average temperature on the die. Thus it may not be sufficient to keep the average temperature of the die below a target level, as excessive heating at hotspots may result in localized device malfunctions even while the overall cooling target is met. This issue may be applicable to proposed cooling systems in which a coolant such as water is circulated through narrow channels (known as "microchannels") which are close to or formed in the die.

Another issue that may be encountered in microchannel cooling systems is the total pressure drop experienced by the coolant through its circulation path. The higher the pressure drop, the greater the demands on the pump that circulates the coolant. If higher pumping capacity is required, it may be necessary to include a larger and/or more expensive and/or less reliable pump. Pump size may be especially critical, since space may be at a premium, as is the case in notebook computers and other portable computer systems.

Still another issue that may be encountered in microchannel cooling systems is potential difficulty in connecting tubes for the coolant path to the potentially delicate cover of a microchannel assembly.

Yet another issue relates to fabricating microchannels that have a high aspect ratio (ratio of height to width). Generally speaking, higher aspect ratios in microchannels provide higher heat transfer rates and lower pressure drops. However, the production processes that may be employed in accordance with known practices to form high-aspect-ratio microchannels may be more expensive than other production processes that produce microchannels having smaller aspect ratios.

Another issue is how to reduce pressure drop by shortening the flow length without changing the geometry of the channels (i.e., to keep parallel flow geometry channels). This may allow for improved manufacturability.

DETAILED DESCRIPTION

Figure 1:
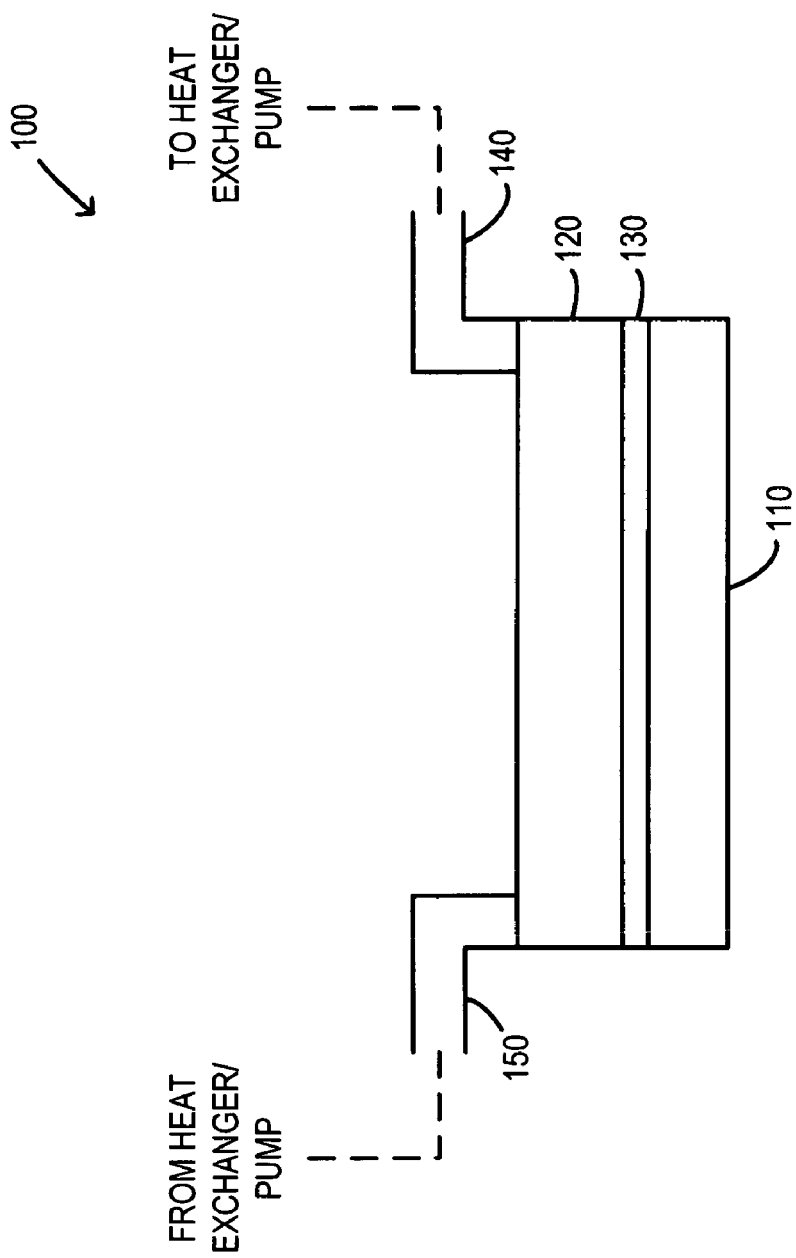
FIG. 1 is a schematic side cross-sectional view of a system.

FIG. 1 is a schematic side cross-sectional view of a system 100 including an Integrated Circuit (IC) 110. The IC 110 may be associated with, for example, an INTEL® PENTIUM IV processor. To help remove heat generated by the IC 110, a liquid coolant (not separately shown) may be circulated through a microchannel cold plate 120. The microchannel cold plate 120 may be located proximate to the IC 110 to facilitate the removal of heat from the system 100. The microchannel cold plate 120 may, for example, be thermally coupled to the IC 110 by a thermal interface material (TIM) 130. (In some cases, the TIM 130 may be omitted and the microchannel cold plate 120 may be directly thermally coupled to the IC 110. In some cases a rear side of the IC 110 may be thinned to reduce thermal resistance between the IC 110 and the microchannel cold plate 120, which may be coupled to the rear side of the IC 110.) Heat may be transferred from the IC 110 to the coolant, which may then leave the system 100. For example, the coolant may exit from the microchannel cold plate 120 via an outlet port 140 and may be circulated to a heat exchanger (not shown) and then to a pump (not shown). The heat exchanger may for example include a length of tube with heat-conductive fins (not shown) mounted thereon and a fan (not shown) to direct air through the fins. Heat transferred to the coolant in the microchannel cold plate 120 may be dissipated at the heat exchanger. After passing through the heat exchanger and the pump, the coolant may flow back to the microchannel cold plate 120 via an inlet port 150.

The coolant may be water, or a liquid antifreeze compound that has a lower freezing point than water, or an aqueous solution of such a compound.

Figure 2:
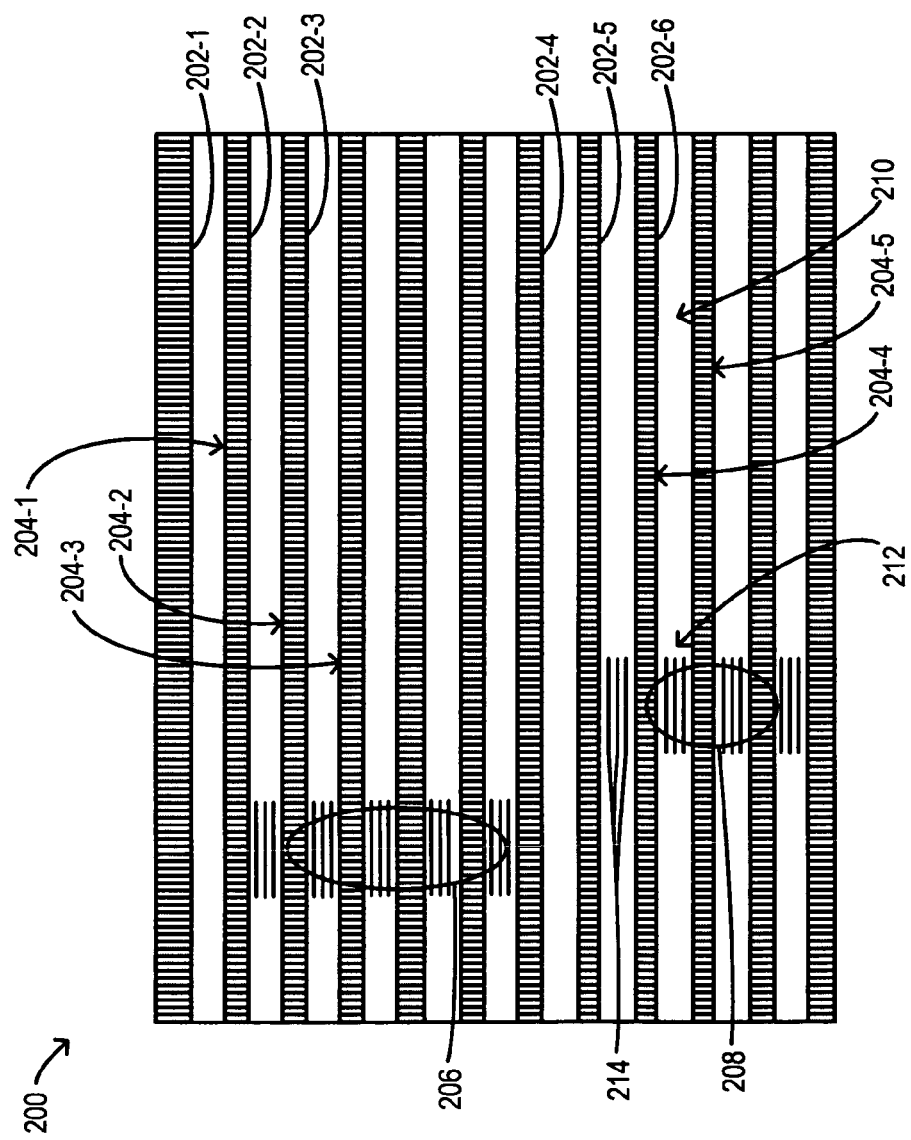
FIG. 2 is a schematic view taken in horizontal cross-section of a microchannel assembly according to some embodiments.

FIG. 2 is a schematic view taken in horizontal cross-section of a microchannel assembly 200 according to some embodiments. The microchannel assembly 200 may be employed as a microchannel cold plate in a system such as that shown in FIG. 1. The microchannel assembly may have microchannels 202-1, 202-2, 202-3, 202-4, 202-5 and 202-6 formed therein, as well as other microchannels which are shown although not associated with reference numerals. (The number of microchannels in the microchannel assembly may be more or fewer than the number illustrated in FIG. 2. Also, the drawing is not necessarily to scale. It will be appreciated by those who are skilled in the art that an inlet plenum may be provided upstream from the microchannels and an outlet plenum may be provided downstream from the microchannels, in the embodiment of FIG. 2 and in other embodiments, although these plenums are not shown, in some cases, so as to simplify the drawings.) The microchannels are defined, in part, by side walls including those indicated by reference numerals 204-1, 204-2, 204-3, 204-4 and 204-5. At least some of the side walls separate adjacent microchannels from each other. It will be appreciated that each microchannel has a length extent which corresponds to a direction in which coolant flows through the microchannel.

The ovals 206, 208 shown in FIG. 2 are indicative of the loci of hotspots in an IC (not shown in FIG. 2) to which the microchannel assembly 200 may be coupled to cool the IC. In accordance with some embodiments, microchannels located on or near the hotspots may be divided into sub-channels at the loci of the hotspots. Such microchannels, including for example microchannel 202-6, may have a first, undivided section 210 at one location along the length extent of the microchannel, and a second, divided section 212 at another location along the length extent of the microchannel. The divided section 212 may include dividing walls 214 (e.g., three dividing walls in the example illustrated, to define four sub-channels) to separate the sub-channels from each other to define the sub-channels along a relatively short portion of the microchannel at or near the locus of the hotspot. It will be noted that the dividing walls are oriented parallel to the length extent of the microchannels in which they are provided. The dividing walls may extend normal to the floor (not shown) of the microchannels.

The microchannels exhibit a first aspect ratio in their undivided portions. The aspect ratio is defined as the ratio of height to width, where the height is the vertical dimension and the width is the horizontal dimension that is transverse to the direction of coolant flow. (As a matter of convention the vertical direction will be taken to be the direction from the microchannel assembly to the IC die which it cools.) It will be understood that the sub-channels share the same height as the undivided portions of the microchannels, but have a much narrower width, and therefore the sub-channels have a much greater aspect ratio than the undivided portions of the microchannels. Because of the greater aspect ratios of the sub-channels, the divided portions of the microchannels provide substantially greater heat transfer capability than the undivided portions, thereby providing targeted improvements in cooling ability at the hotspots. There may be an increased pressure drop at the divided portions of the microchannels, but since the divided portions run for only a relatively short distance along the microchannels, the total pressure drop caused by the dividing of the microchannels may be rather small, so that the targeted dividing of the microchannels may lead to an improved trade-off between heat transfer capability and pressure drop. The use of targeted division of the microchannels may satisfy cooling requirements while allowing use of a relatively reliable centrifugal pump rather than a higher capacity but less reliable positive displacement pump. As an alternative to either of these types of pump, an electrokinetic pump may be employed. With any type of pump, the relatively small pressure drop associated with the targeted division of microchannels may allow for savings in terms of the power requirements for the pump and/or the size and capacity of the pump.

The number of sub-channels into which a microchannel is divided may be more or fewer than the four sub-channels shown in the exemplary embodiment of FIG. 2, and the number of sub-channels may vary from microchannel to microchannel. The microchannels need not be straight. Exemplary dimensions of the microchannels (in the undivided sections) may be 150 microns wide by 300 microns high, although these dimensions may be varied as appropriate. The microchannels may be formed in a conventional material, such as silicon or copper, and by a conventional process, such as dry etching. Although not shown in the drawings, the microchannel assembly 200 may also include, in accordance with conventional practices, an inlet reservoir or manifold at one end of the microchannels and an outlet reservoir or manifold at the other end of the microchannels.

Figure 3:
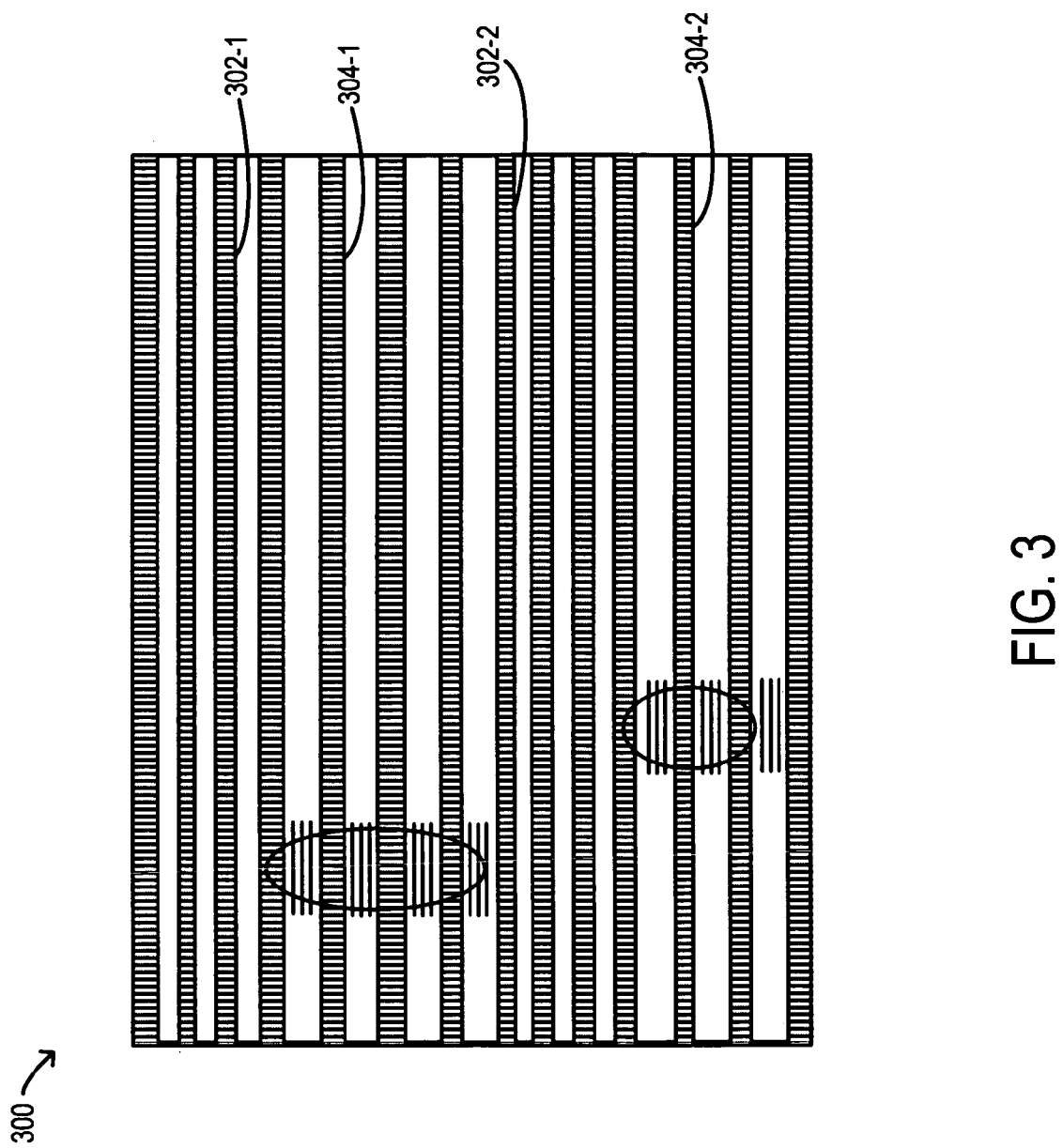
FIG. 3 is a view similar to FIG. 2 of a microchannel assembly according to some other embodiments.

FIG. 3 is a view similar to FIG. 2 of a microchannel assembly 300 according to some other embodiments. The microchannel assembly 300 may be the same as the microchannel assembly 200 of FIG. 2, except that at least some of the microchannels (e.g., microchannels 302-1, 302-2) which are not subdivided and do not pass over hotspots may have a narrower width than the width exhibited at undivided portions of the microchannels (e.g., 304-1, 304-2) that pass over and are subdivided at hotspots. The provision of narrow channels that do not cool hotspots may help to balance the pressure drop among all microchannels and to allow for adequate coolant flow into the divided microchannels that cool hotspots. As in the prior example, the wider microchannels may, in their undivided sections, be 150 microns wide by 300 microns high, and the narrower microchannels may be 50 microns wide by 300 microns high. Again, the dimensions may be varied as appropriate.

Figure 3A:
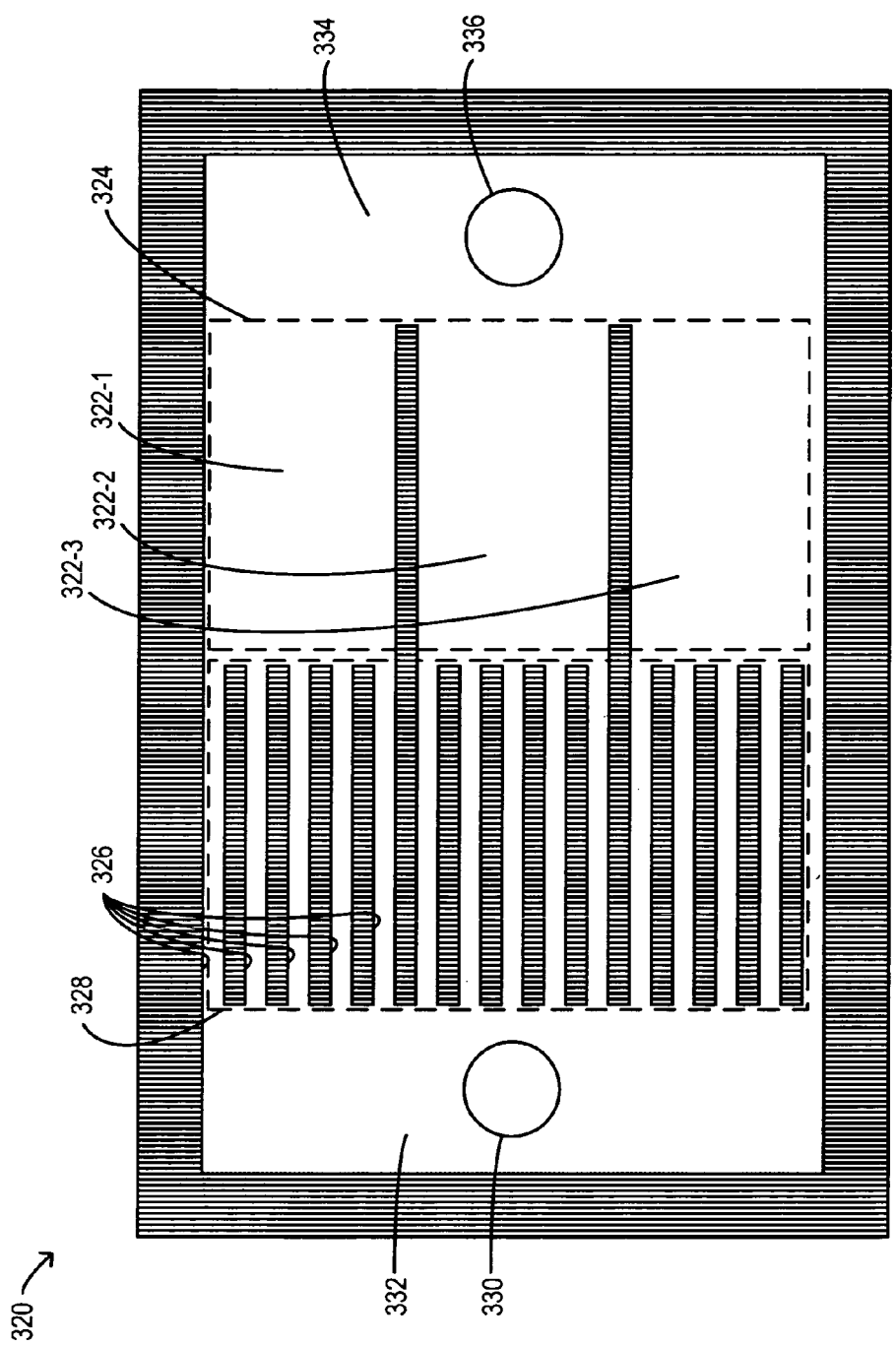
FIG. 3A is a view similar to FIGS. 2 and 3 of a microchannel assembly according to other embodiments.

FIG. 3A is a view similar to FIGS. 2 and 3 of a microchannel assembly 320 according to other embodiments. The microchannel assembly has relatively wide or sparse microchannels 322-1, 322-2, 322-3 at the locus of a cache area (indicated by dashed-line rectangle 324 and being a portion of a microprocessor which generally is not shown), which requires a relatively small cooling efficiency. The microchannels 322 are divided into relatively narrow or dense sub-channels 326 at the locus of a core area (indicated by dashed-line rectangle 328), which is a part of the microprocessor that requires a greater cooling efficiency. In the particular example shown in FIG. 3A, each microchannel 322 is divided into five sub-channels 326 at the core area 328. It will be appreciated that the sub-channels 326 have a greater aspect ratio than the undivided portions of the microchannels 322. (The number of microchannels and/or the number of sub-channels may be more or fewer than the number illustrated in FIG. 3A, and the drawing is not necessarily to scale.)

Coolant (not shown) flows to the sub-channels 326 via an inlet 330 and an inlet plenum 332. The coolant flows out of the microchannels 322 via an outlet plenum 334 and an outlet 336. (It will be appreciated that the direction of coolant flow may be reversed in some embodiments.)

Figure 4:
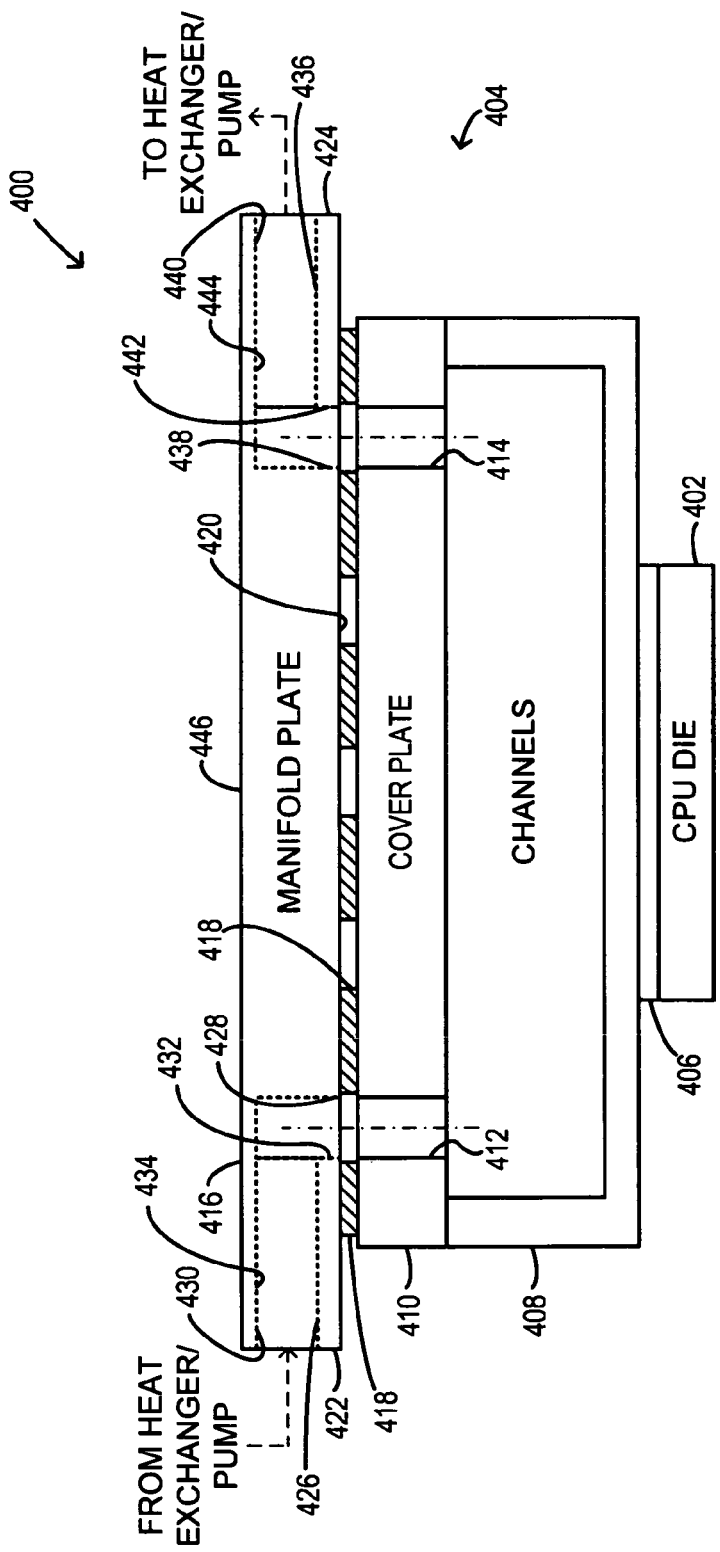
FIG. 4 is a schematic side cross-sectional view of a system according to still other embodiments.

FIG. 4 is a schematic side cross-sectional view of a system 400 according to still other embodiments. The system 400 includes an IC 402 (e.g. a microprocessor or "CPU" die) and a microchannel assembly 404 thermally coupled to the IC 402 by a TIM 406. The microchannel assembly 404 includes a microchannel structure 408 which has microchannels (not shown in detail) formed therein. In particular, the microchannel structure 408 may define bottom and side walls of microchannels in which coolant is to be transported in proximity to the IC 402 for heat to be transferred to the coolant from the IC 402. The microchannel structure 408 may be provided in accordance with conventional practices or may be configured as in one of the microchannel assemblies illustrated in FIGS. 2 and 3. Other variations in the microchannel layout are possible.

The microchannel assembly 404 also includes a cover plate 410 positioned on (e.g., bonded to) the microchannel structure 408 to define top walls of the microchannels. The cover plate 410 may be provided in accordance with conventional practices and may have formed therein an inlet port 412 and an outlet port 414. The inlet port 412 is to allow coolant to flow into the microchannel structure 408 and the outlet port 414 is to allow coolant to flow out of the microchannel structure 408.

In addition, the microchannel assembly 404 includes a manifold plate 416 that is mounted on the cover plate 410 to facilitate connection to the microchannel assembly of tubing (not shown) for the coolant. The manifold plate 416 may, for example, be adhered to the top surface of the cover plate 410 by solder or by a sealant 418 such as epoxy or silicone. The manifold plate 416 has a lower horizontal surface 420, a left side vertical surface 422 and a right side vertical surface 424. (As used herein and in the appended claims, a "vertical surface" should be understood to include any surface that departs substantially from the horizontal; and "horizontal" refers to any direction normal to the direction from the microchannel assembly to the IC.)

The manifold plate 416 has formed therein an inlet passage 426. The inlet passage 426 provides fluid communication between a port 428 on the lower horizontal surface 420 of the manifold plate 416 and a port 430 on the left side vertical surface 422. The inlet passage 426 is a right-angle passage in that it is formed of a vertical course 432 and a horizontal course 434 that joins the vertical course 436 at a right angle. (More generally, as used herein and in the appended claims, "right-angle passage" refers to any passage that supports at least an 85° change in flow direction therethrough.) The manifold plate 416 is adhered to the cover plate 410 in such a manner that the port 428 of the manifold plate 416 is aligned with the inlet port 412 of the cover plate 410. Advantageously, the sealant 418 (or alternatively solder, as the case may be) is deployed in such a manner that coolant flows from the port 428 to the inlet port 412 without leakage.

The manifold plate 416 also has formed therein an outlet passage 436. The outlet passage 436 provides fluid communication between a port 438 on the lower horizontal surface 420 of the manifold plate 416 and a port 440 on the right side vertical surface 424. The outlet passage 436 is a right-angle passage in that it is formed of a vertical course 442 and a horizontal course 444 that joins the vertical course at a right angle. The port 438 of the manifold plate 416 is aligned with the outlet port 414 of the cover plate 410. Sealant 418 (or solder, as the case may be) may be deployed in such a manner that coolant flows from the outlet port 414 to the port 438 without leakage.

A clamp (not shown) or the like may apply a downward force to the upper surface 446 of the manifold plate 416 to retain the manifold plate 416 in position on the cover plate 410.

The manifold plate 416 may be formed of a suitable material such as copper, ceramic or polymer. Each passage 426, 436 may be formed with two drilling operations—one from the horizontal surface 420 and one from the vertical surface 422 or 424 as the case may be. It is not critical as to the order in which the two drilling operations are performed for a given one of the passages 426, 436. In some embodiments a molding process may performed as an alternative to drilling. For example, the manifold plate may have suitable fittings incorporated therein and may be formed by molding around metal tubes that constitute the right angle passages and the fittings.

The presence of the manifold plate 416 as part of the microchannel assembly 404 may facilitate connection of tubing (for coolant circulation) to the microchannel assembly 404. A tube (not shown) leading from the heat exchanger and the pump (both not shown) may be connected at the port 430 of the inlet passage 426 of the manifold plate 416. Another tube (not shown) leading to the heat exchanger and the pump may be connected at the port 440 of the outlet passage 436 of the manifold plate 416. The manifold plate 416 may be more robust than a typical cover plate for a microchannel assembly and may reduce the possibility of breakage of the cover plate, and may help to insure reliable tube connection. In general, the presence of the manifold plate may facilitate high volume manufacturing (HVM) with regard to the system.

Moreover, the horizontal-facing ports 430, 440 of the passages 426, 436, respectively, may allow for improvements in form factor for the cooling system as a whole. Also, if it is desired to modify the configuration of the tubing and/or manner of connection of tubing to the microchannel assembly, such a modification may be accommodated by a manifold plate having a different configuration, without requiring modification of the cover plate. In other words, the manifold plate may be tailored to match the desired orientation of inlet/outlet tubes, while keeping the cover plate and microchannel structure unchanged.

Figure 5:
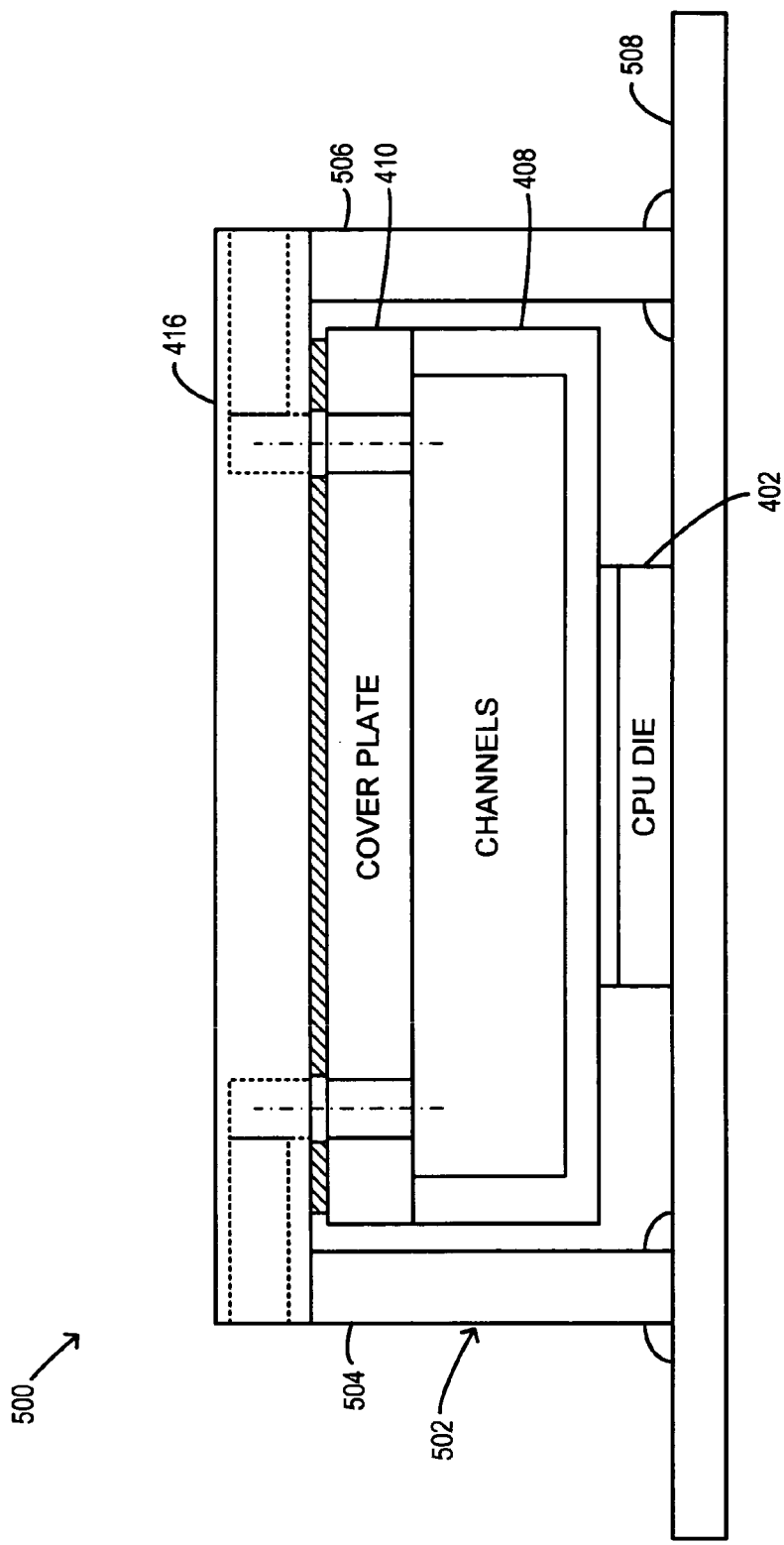
FIG. 5 is a view similar to FIG. 4 of a system according to other embodiments.

FIG. 5 is a view similar to FIG. 4 of a system 500 according to other embodiments. The system 500 may include all of the constituent parts of the system 400 (FIG. 4) as described above, but in the system 500 the manifold plate 416 is integrated with the package 502 for the IC 402. In particular, the manifold plate may form the upper wall of the package 502, which may also be formed of (a) side walls 504, 506 joined to the manifold plate 416 at respective ends of the manifold plate 416, and (b) a package substrate 508 on which the IC 402 is mounted, and which is joined to the lower ends of the side walls 504, 506.

In the system 500, with the microchannel assembly effectively integrated with the IC package, it may not be necessary to apply an external retaining force to keep the manifold plate 416 in place on the cover plate 410.

Figure 6:
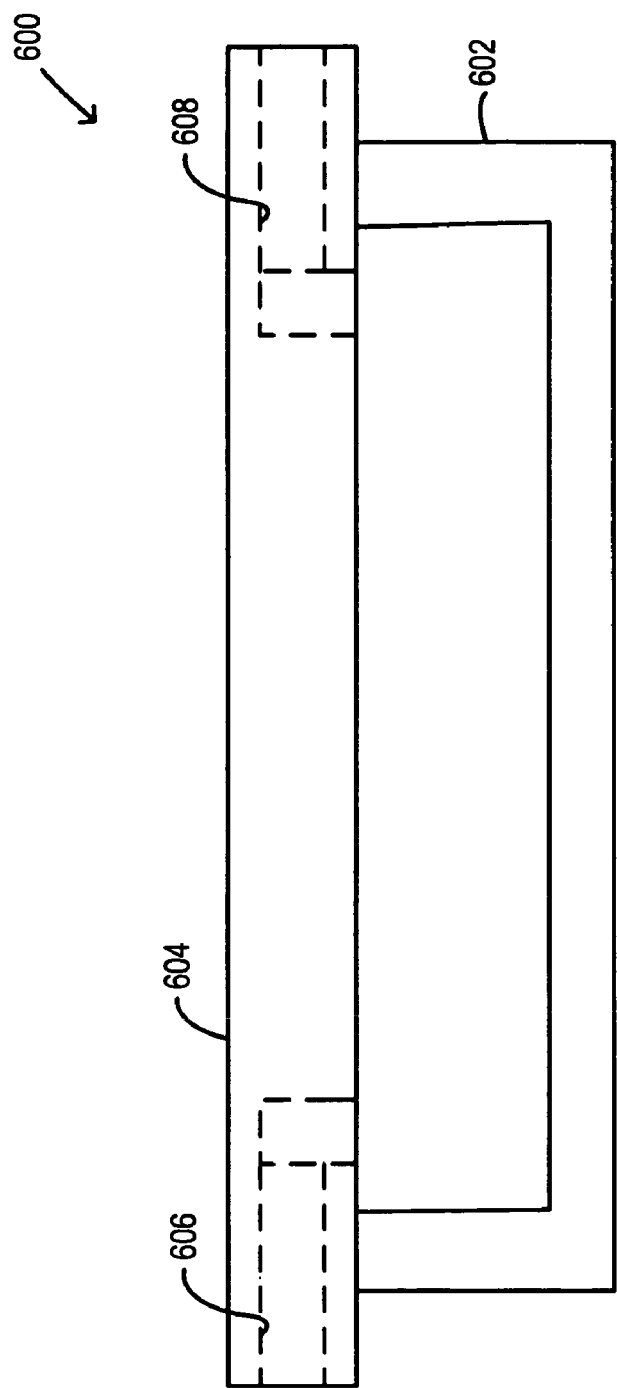
FIG. 6 is a schematic side cross-sectional view of a microchannel assembly according to further embodiments.

FIG. 6 is a schematic side cross-sectional view of a microchannel assembly 600 according to further embodiments. The microchannel assembly 600 may include a microchannel structure 602 which is like the microchannel structure 408 described above in connection with FIG. 4. In addition, the microchannel assembly 600 may include a cover plate 604 positioned on the microchannel structure 600. The cover plate 604 may be formed in similar manner to the manifold plate 416 described above in connection with FIG. 4. In particular, the cover plate 604 may have formed therein two right-angle passages 606, 608 like the inlet passage 426 and the outlet passage 436 described above in connection with FIG. 4. Thus, in this microchannel assembly 600, the cover plate and manifold plate of previously described embodiments may effectively be integrated together to form a plate which defines upper walls of the microchannels while facilitating connection of tubing to the microchannel assembly.

In the manifold plate 416 and cover plate 604 illustrated above, the horizontal course of the outlet passage is formed at the opposite vertical surface from the horizontal course of the inlet passage. However, in alternative embodiments, the horizontal courses of both the inlet passage and the outlet passage may be formed at the same surface or at respective vertical surfaces that are oriented 90° apart from each other (i.e., at adjoining vertical surfaces).

Figure 7:
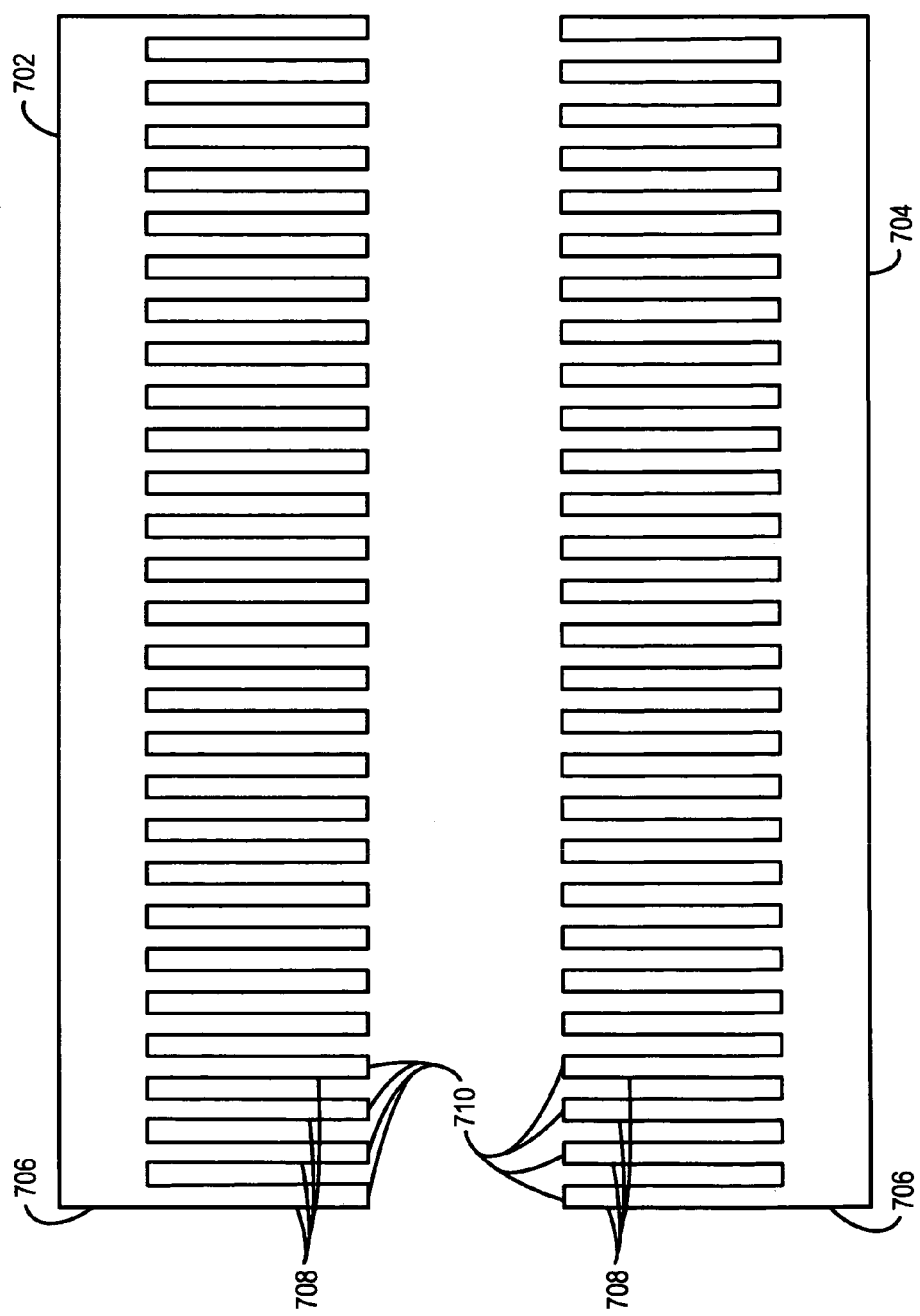
FIG. 7 is a schematic side cross-sectional view showing two members from which a microchannel assembly may be constructed in accordance with some embodiments.
Figure 8:
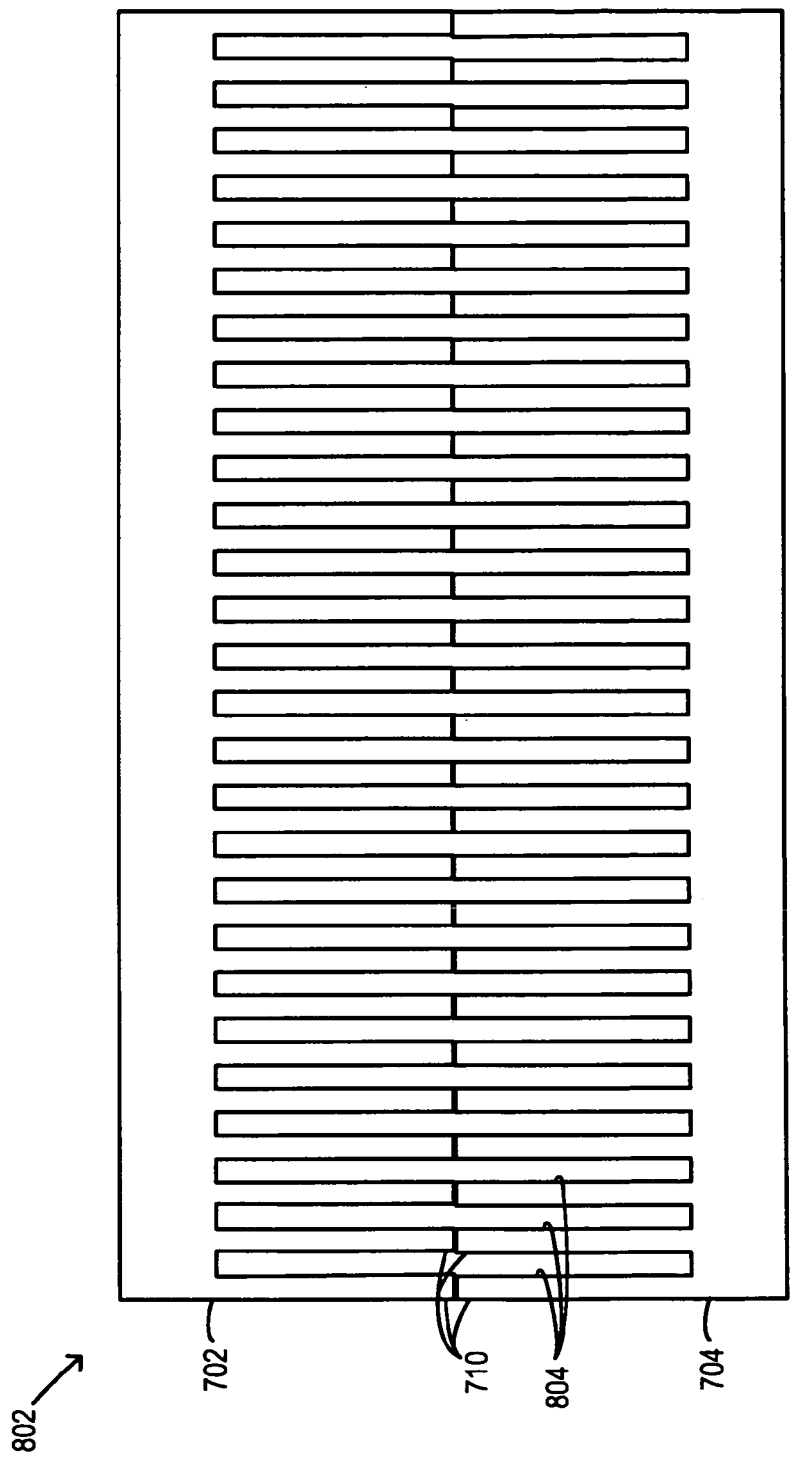
FIG. 8 is a schematic side cross-sectional view showing the microchannel assembly constructed from the members shown in FIG. 7.

FIG. 7 is a schematic side cross-sectional view showing two members 702, 704 from which a microchannel assembly may be constructed in accordance with some embodiments. FIG. 8 is a schematic side cross-sectional view showing the resulting microchannel assembly 802 constructed from the members 702, 704. In both drawings, the cross-section is taken transversely to the direction of flow of the coolant. Each of the members 702, 704 may be generally in the form of a conventional microchannel structure (which would be covered by a flat lid if conventional practice were to prevail). Alternatively, varying microchannel widths and/or subdividing of microchannels at hotspots, as described above, may be implemented in the members 702, 704. The members 702, 704 may be identical to each other in over-all form, except, e.g., for features such as inlet/outlet holes (not shown) in one of the members 702, 704. Thus each member may have a base 706 and parallel walls 708 each extending normally from the base 706. The walls 708 are for defining side walls of the microchannels 804 (FIG. 8) in the resulting microchannel assembly 802. Each of the walls 708 has a respective outer end 710.

In assembling the microchannel assembly 802 from the members 702, 704, the members 702, 704 may be bonded to each other by bonding the respective outer end 710 of each of the parallel walls 708 of the member 702 to the respective outer end 710 of a respective parallel wall 708 of the member 704 in a mirror-image configuration as shown in FIG. 8. In this arrangement, the walls 708 of member 702 cooperate with walls 708 of member 704 to define the side walls of the microchannels 804. In particular, in this arrangement, the walls 708 of member 702 provide half the height of the microchannels 804 while the walls 708 of member 704 provide the other half of the height of the microchannels 804.

Each of the members 702, 704 may be made of a conventional material for a microchannel structure and the gaps between the parallel walls may be formed by a conventional and relatively inexpensive process such as dry etching to provide gaps having an aspect ratio of about five, for example. It will be appreciated that the microchannels in the resulting microchannel assembly 802 have twice the aspect ratio (ten in this example) of the gaps. In this way, an advantageous process may be employed to form high aspect ratio microchannels even though the process if employed in a conventional manner could only produce lower aspect ratio microchannels. With the higher aspect ratio for the microchannels, the pressure drop for the coolant flow through the microchannels may be reduced, thereby in turn reducing the requirements for the pump employed in the cooling system. Also, the increased aspect ratio may promote an improved heat transfer rate and thus more effective cooling.

Each of the members 702, 704 may, in some embodiments, be formed as a unitary body. The bonding of one member to another may be by diffusion bonding, eutectic bonding or other suitable process.

Figure 9:
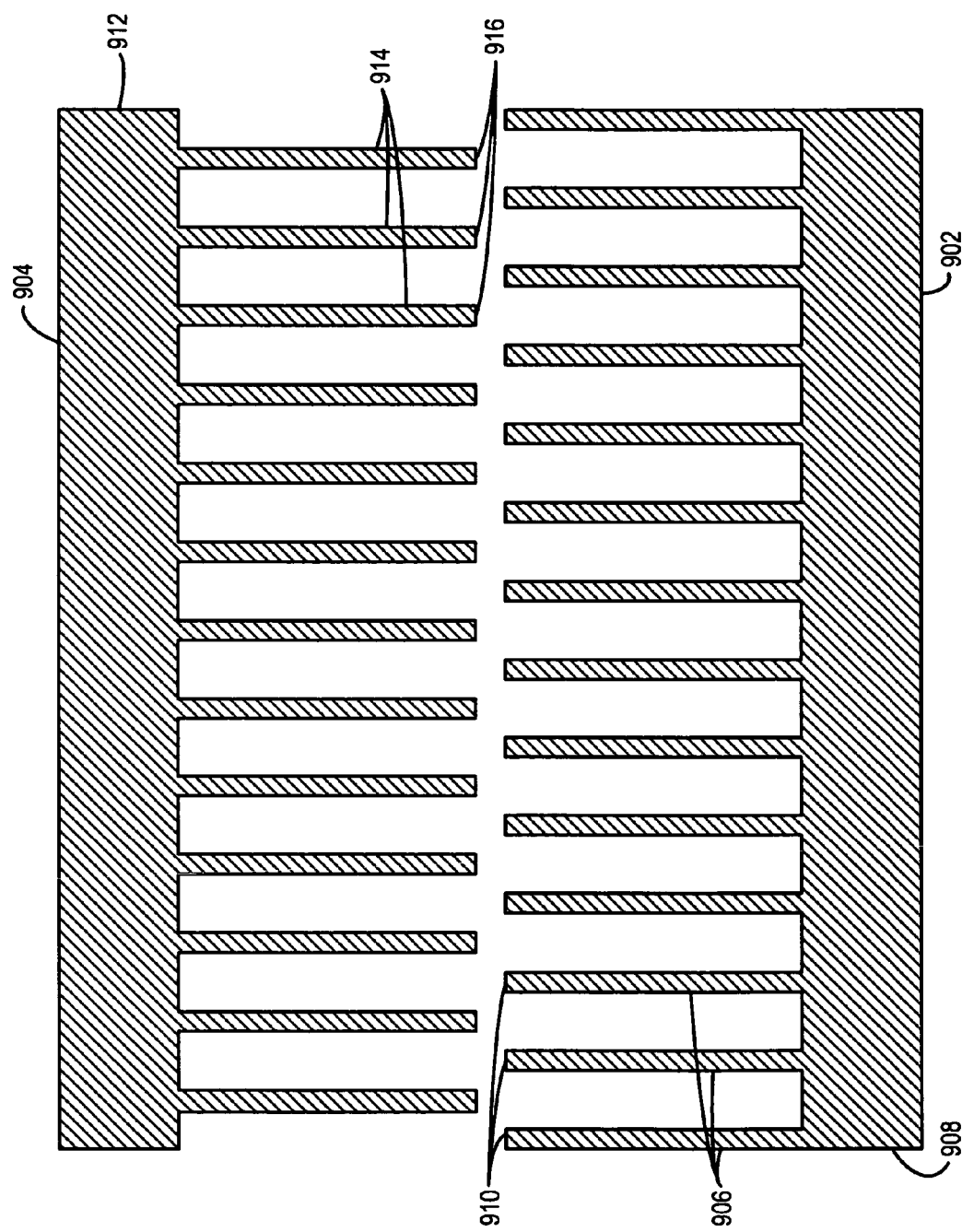
FIG. 9 is a schematic side cross-sectional view showing two members from which a microchannel assembly may be constructed in accordance with some other embodiments.
Figure 10:
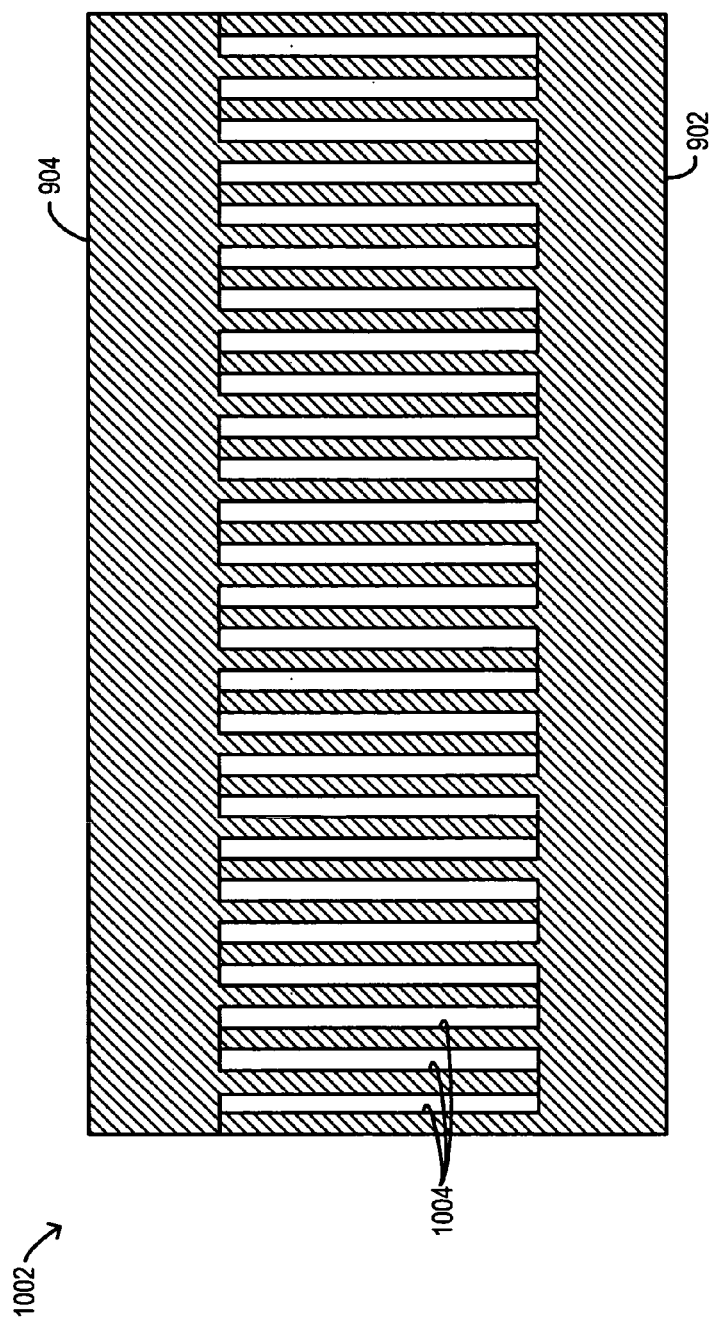
FIG. 10 is a schematic side cross-sectional view showing the microchannel assembly constructed from the members shown in FIG. 9.

FIG. 9 is a schematic side cross-sectional view showing two members 902, 904 from which a microchannel assembly may be constructed in accordance with some other embodiments. FIG. 10 is a schematic side cross-sectional view showing the resulting microchannel assembly 1002 constructed from the members 902, 904. In both drawings, the cross-section is taken transversely to the direction of flow of the coolant.

Member 902 may be generally in the form of a conventional microchannel structure (to be covered by a flat lid if conventional practice were to prevail), but possibly with deeper and wider gaps formed between parallel walls 906, which extend normally from base 908 of member 902. Each wall 906 has a respective outer end 910.

Member 904 may be similar to member 902, and may have a base 912 and parallel walls 914 which extend normally from base 912. Member 904 may differ from member 902 in that the outermost ones of the walls 914 may both be recessed from a respective end of the base 912. In other embodiments, however, the members 904, 902 may be substantially identical, except possibly for the presence of inlet and outlet holes in one of the members. Each wall 914 has a respective outer end 916.

In assembling the microchannel assembly 1002 from members 902, 904, the walls 906 of member 902 may be interleaved with the walls 914 of member 904 and the outer ends 910 of walls 906 of member 902 may be bonded to the base 912 of the member 904, and the outer ends 916 of walls 914 of member 904 may be bonded to the base 908 of the member 902. In this arrangement, the walls 906 of member 902 cooperate with the walls 914 of the member 904 to define microchannels 1004 (FIG. 10) in the microchannel assembly 1002. In particular, in each microchannel, one side wall is defined by a wall 906 of member 902 and the other side wall is defined by a wall 914 of member 904.

Each of the members 902, 904 may be made of a conventional material for a microchannel structure and the gaps between parallel walls may be formed by a conventional and relatively inexpensive process such as dry etching to provide gaps having an aspect ratio of five, for example. It will be appreciated that the microchannels in the resulting microchannel assembly 1002 have an aspect ratio that is more than twice the aspect ratio of the gaps in the individual members. In this way, an advantageous process may be employed to form high aspect ratio microchannels even though the process if employed in a conventional manner could only produce a lower aspect ratio microchannel. With the higher aspect ratio, lower pressure drops and/or improved heat transfer may be achieved.

Each of the members 902, 904 may, in some embodiments, be formed as a unitary body. The bonding of one member to another may be by diffusion bonding, eutectic bonding or other suitable process.

Figure 11:
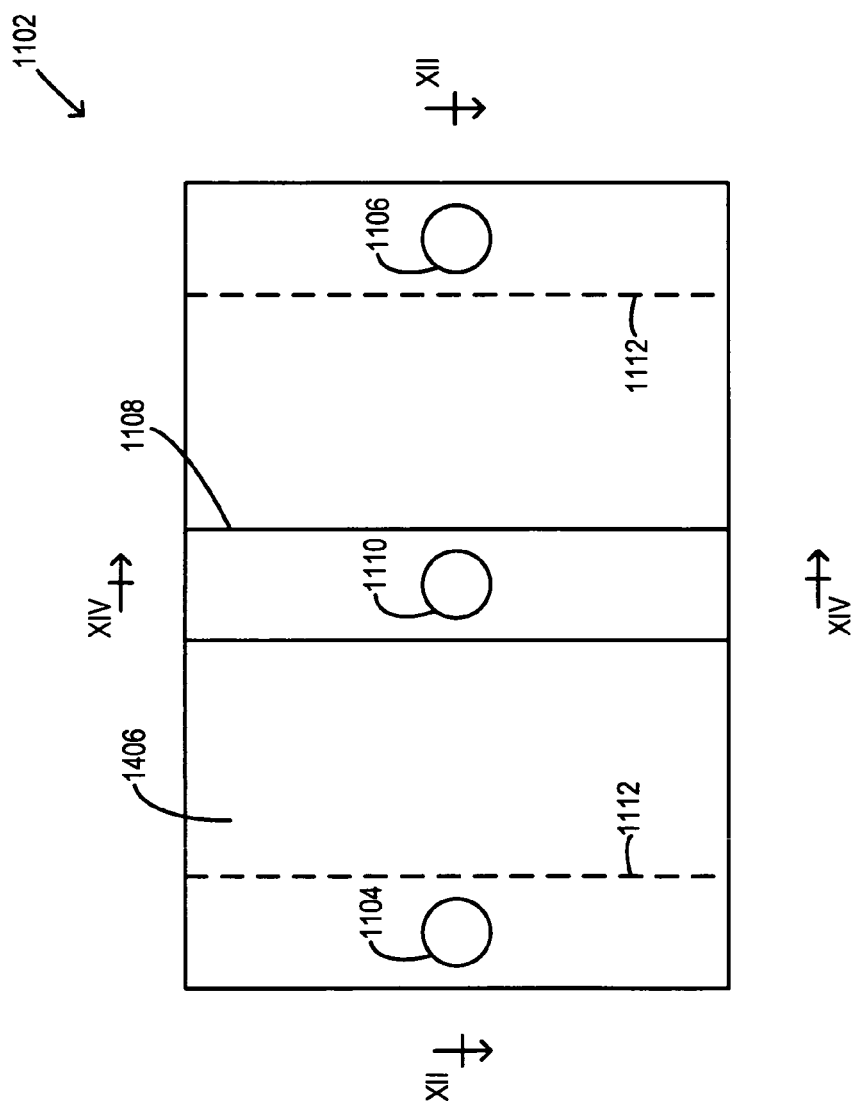
FIG. 11 is a schematic plan view of a microchannel assembly according to still further embodiments.
Figure 12:
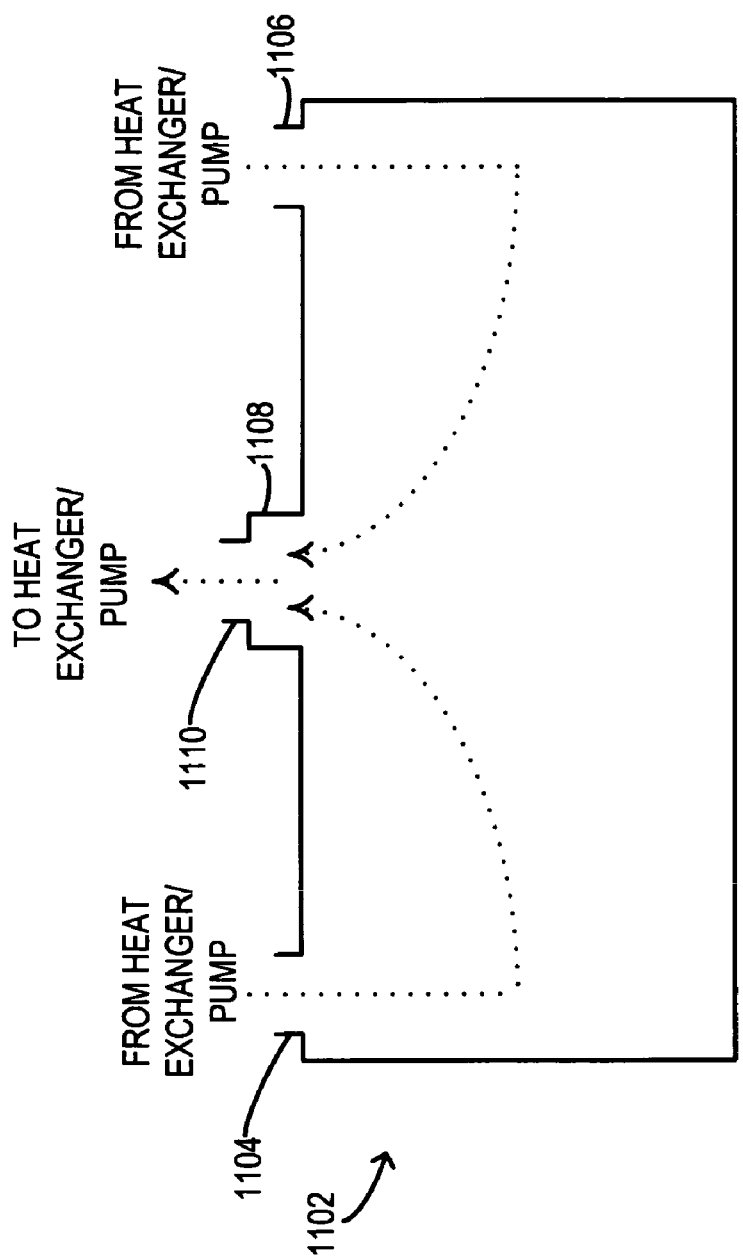
FIG. 12 is a schematic vertical sectional view taken along line XII-XII in FIG. 11.
Figure 14:
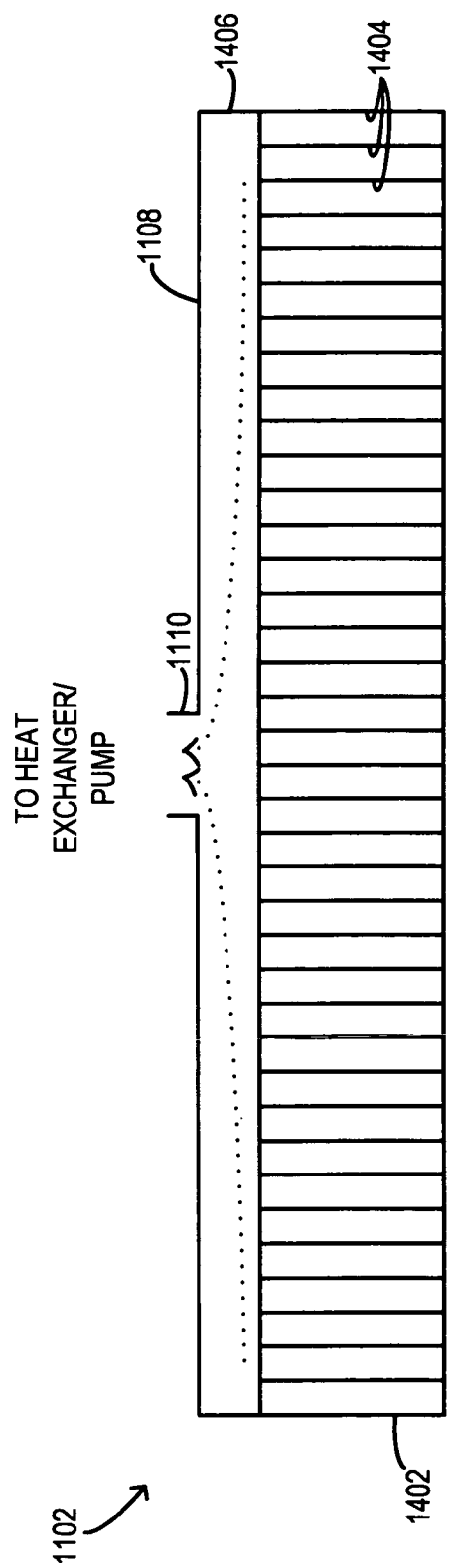
FIG. 14 is a schematic vertical sectional view taken along line XIV-XIV in FIG. 11.

FIG. 11 is a schematic plan view of a microchannel assembly 1102 according to still further embodiments. FIG. 12 is a schematic vertical sectional view of the microchannel assembly 1102 taken along line XII-XII in FIG. 1. FIG. 14 is a schematic vertical sectional view of the microchannel assembly 1102 taken along line XIV-XIV in FIG. 11.

The microchannel assembly 1102 includes a microchannel structure 1402 (FIG. 14) which has microchannels 1404 formed therein. The microchannels 1404, as in previous embodiments, are for transporting a coolant and are to be located proximate to an integrated circuit (not shown in FIGS. 11, 12, 14) to transfer heat from the IC to the coolant. The microchannel structure 1402 may be provided in accordance with conventional practices or alternatively may be configured as described in connection with FIGS. 2 and 3.

The microchannel assembly 1102 also includes a lid 1406 (FIG. 14) which is positioned on the microchannel structure 1402 to define the upper walls of the microchannels 1404. As best seen in FIG. 11, the lid 1406 has formed therein an inlet 1104 and an inlet 1106. The inlets 1104, 1106 are located at respective opposite ends of the microchannel assembly 1102 and hence are formed at respective opposite ends of the lid 1406. The inlets are to allow coolant to flow into the microchannel assembly 1102.

The lid 1406 also has a plenum 1108 (FIGS. 11, 12, 14) formed therein. As indicated in FIG. 14, the plenum 1108 extends across and above the microchannels 1404 at a central location of the microchannels. More specifically, and as seen from FIG. 11, the longitudinal axis of the plenum 1108 is perpendicular to a line (not shown) drawn from one inlet 1104 to the other inlet 1106 and is substantially equidistant from, and positioned between, the inlets 1104, 1106. It will be noted that the plenum 1108 is centrally located relative to the microchannel assembly. At a central location along the plenum 1108, an outlet 1110 is formed to allow coolant to flow out of the microchannel assembly 1102. In some embodiments, a manifold (not shown) may be positioned on the lid 1406 to manage distribution of coolant between the inlets 1104, 1106 and to take coolant out from the outlet 1110.

The lid may, for example, be formed of copper and the plenum may be formed by a stamping operation.

In operation, coolant is flowed into the microchannel assembly 1102 via the inlets 1104, 1106. The coolant flows from the inlets into opposite ends of the microchannels via reservoirs 1112 (indicated in phantom in FIG. 11). The coolant flows from the opposite ends of each microchannel to a central location of the respective microchannel, as indicated in FIG. 12. From the central location in the microchannel, the coolant flows up into the plenum 1108. In the case of each microchannel not located directly under the outlet 1110, the coolant from the respective microchannel flows through the plenum toward the outlet 1110 (i.e., toward the center of the lid 1406). The coolant then flows out of the microchannel assembly via the outlet 1110.

With this arrangement of flowing coolant from both ends of each microchannel toward a central location along the microchannel, the path of coolant flow along the microchannel from inlet to outlet is reduced by one-half relative to a given over-all length of the microchannel. As a result, the pressure drop along the coolant path from inlet to outlet may be substantially reduced (e.g., by about half), thereby reducing the requirements for the pump needed in the cooling system.

Figure 13:
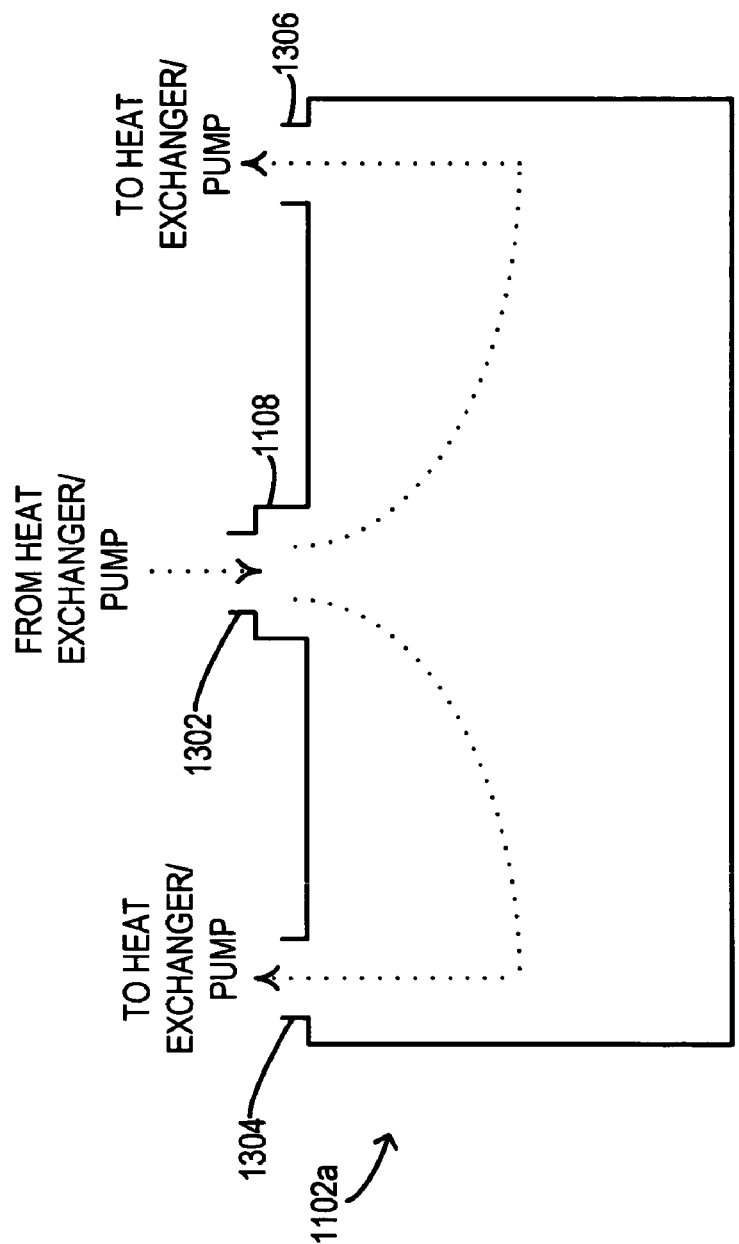
FIG. 13 is view similar to FIG. 12, showing an alternative embodiment.

Instead of flowing the coolant from the ends of the microchannels toward the center of the microchannel assembly, in other embodiments the coolant may flow from the center of the microchannel assembly out toward both ends of the microchannels, as schematically illustrated in FIG. 13. In this case essentially the same structure may be used, but the central port is used as an inlet (labeled 1302 in FIG. 13), and the ports at the ends of the microchannel are used as dual outlets (labeled 1304, 1306 in FIG. 13).

The various embodiments described above may be combined in a variety of ways. For example, the manifold plate (FIGS. 4, 5) or integrated manifold/lid (FIG. 6) may be used in conjunction with the microchannel structures of FIGS. 2, 3 or 8, 10 and/or with the reduced flow length inlet/outlet arrangements of FIGS. 11-14. For example, a manifold plate or lid may provide right-angle passages for each of the inlets/outlets shown in the embodiments or FIGS. 11-14. Other combinations of features disclosed herein may also be implemented.

Figure 15:
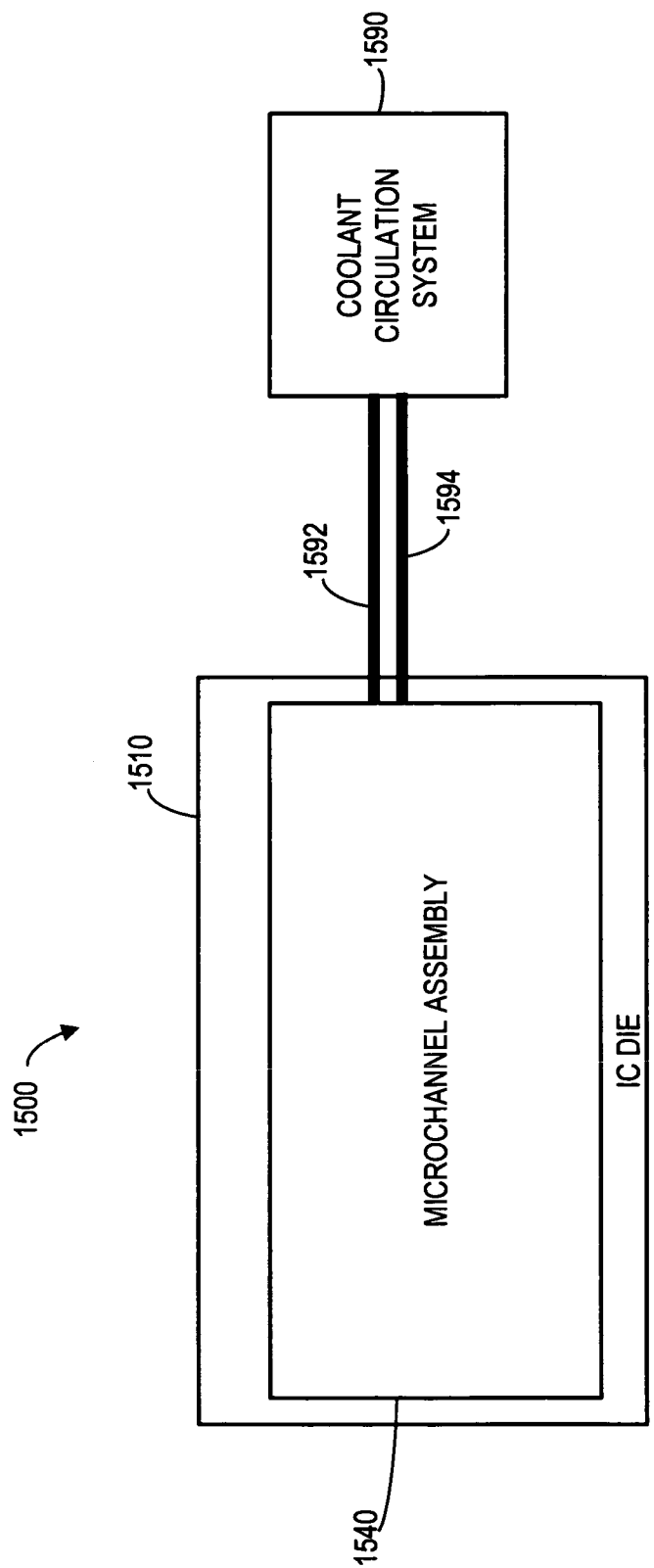
FIG. 15 is a block diagram showing a die with additional components of a cooling system according to some embodiments.

FIG. 15 is a block diagram showing an IC die 1510 and additional components of a cooling system 1500. For purposes of illustration the microchannel assembly 1540 (which may be any one of the microchannel assemblies described above) is shown as a single block. The cooling system 1500 includes a coolant circulation system 1590 to supply the coolant to the microchannel assembly 1540. The coolant circulation system 1590 may be in fluid communication with the microchannel assembly 1540 via one or more coolant supply channels or lines 1592 and one or more coolant return channels 1594. Although not separately shown, a pump and a heat exchanger located remotely from the die 1510 may be included in the coolant circulation system 1590.

Coolant supplied by the coolant circulation system 1590 may flow through the microchannels of the microchannel assembly 1540 at or above the rear surface of the IC die 1510 to aid in cooling the IC die 1510. In some embodiments, the coolant is operated with two phases—liquid and vapor. That is, in some embodiments at least part of the coolant in the microchannels is in a gaseous state. In other embodiments, the coolant is single phase—that is, all liquid.

Figure 16:
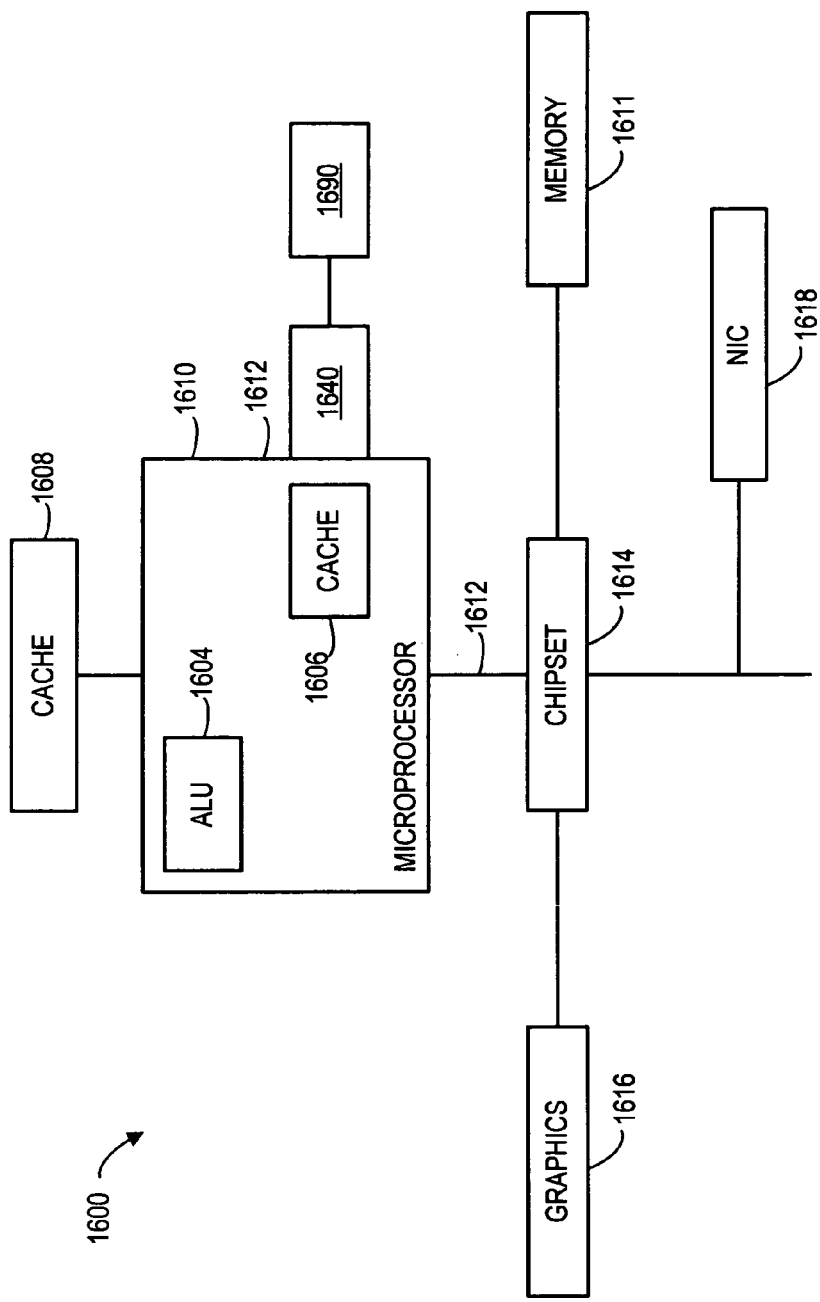
FIG. 16 is a block diagram of a computer system according to some embodiments that includes an example of an integrated circuit die associated with a cooling system as in one or more of FIGS. 2-14.

The IC die 1510 may be associated with a microprocessor in some embodiments. FIG. 16 is a block diagram of a system 1600 in which such a die 1610 may be incorporated. In particular, the die 1610 includes many sub-blocks, such as an Arithmetic Logic Unit (ALU) 1604 and an on-die cache 1606. The microprocessor on die 1610 may also communicate to other levels of cache, such as off-die cache 1608. Higher memory hierarchy levels, such as system memory 1611, may be accessed via a host bus 1612 and a chipset 1614. In addition, other off-die functional units, such as a graphics accelerator 1616 and a Network Interface Controller (NIC) 1618, to name just a few, may communicate with the microprocessor on die 1610 via appropriate busses or ports.

The IC die 1610 may be cooled in accordance with any of the embodiments described herein. For example, a pump 1690 may circulate a coolant (e.g., including water) through a cold plate 1640 proximate to the IC die 1610 and having at least one microchannel to transport the coolant.

The system architecture shown in FIG. 16 is exemplary; other system architectures may be employed.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A system comprising:
a microprocessor integrated circuit die, the microprocessor integrated circuit die including at least one hotspot at which circuit elements in the die cause a temperature increase in excess of an average temperature on the die;
a microchannel structure thermally coupled to the microprocessor integrated circuit die, the microchannel structure having microchannels formed therein, said microchannels to transport a coolant and to be proximate to an integrated circuit to transfer heat from the integrated circuit to the coolant, at least one of said microchannels having a length extent and having a first section at a first location along said length extent and a second section at a second location along said length extent, said first section having a first aspect ratio and said second section divided into at least two sub-channels, each sub-channel having a respective second aspect ratio that is greater than said first aspect ratio, said second section located at said at least one hotspot, said first section not located at said at least one hotspot; and a chipset in communication with the microprocessor integrated circuit die.

2. The system of claim 1, wherein said second section includes at least one dividing wall oriented parallel to said length extent, said at least one dividing wall separating said sub-channels from each other.

3. The system of claim 2, wherein said second section is divided into at least four sub-channels, said at least one dividing wall including at least three dividing walls.

4. The system of claim 3, wherein all of said dividing walls are substantially equal to each other in length.

5. The system of claim 4, wherein said coolant flows from said first section to said second section or from said second section to said first section.

6. The system of claim 4, wherein:
said at least one of the microchannels has a third section at a third location along said length extent, said third location at an opposite side of said second location from said first location, said third section of said at least one microchannel having said first aspect ratio.

7. The system of claim 6, wherein said coolant flows from said first section to said second section and from said second section to said third section.

8. A system comprising:
a microprocessor integrated circuit die, the microprocessor integrated circuit die including at least one hotspot at which circuit elements in the die cause a temperature increase in excess of an average temperature on the die; and
a microchannel structure thermally coupled to the microprocessor integrated circuit die, the microchannel structure having microchannels formed therein, said microchannels to transport a coolant and to be proximate to an integrated circuit to transfer heat from the integrated circuit to the coolant, at least one of said microchannels having a length extent and having a first section at a first location along said length extent and a second section at a second location along said length extent, said first section having a first aspect ratio and said second section divided into at least two sub-channels, each sub-channel having a respective second aspect ratio that is greater than said first aspect ratio, said second section located at said at least one hotspot, said first section not located at said at least one hotspot.

9. The system of claim 8, wherein said second section includes at least one dividing wall oriented parallel to said length extent, said at least one dividing wall separating said sub-channels from each other.

10. The system of claim 9, wherein said second section is divided into at least four sub-channels, said at least one dividing wall including at least three dividing walls.

11. The system of claim 10, wherein all of said dividing walls are substantially equal to each other in length.

12. The system of claim 8, wherein said coolant flows from said first section to said second section or from said second section to said first section.

13. The system of claim 8, wherein:
said at least one of the microchannels has a third section at a third location along said length extent, said third location at an opposite side of said second location from said first location, said third section of said at least one microchannel having said first aspect ratio.

14. The system of claim 13, wherein said coolant flows from said first section to said second section and from said second section to said third section.

* * * * *